(12) United States Patent
Hiyoshi

(10) Patent No.: US 6,756,667 B2
(45) Date of Patent: *Jun. 29, 2004

(54) HERMETICALLY SEALED SEMICONDUCTOR POWER MODULE AND LARGE SCALE MODULE COMPRISING THE SAME

(75) Inventor: Michiaki Hiyoshi, Tokyo (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/917,876

(22) Filed: Jul. 31, 2001

(65) Prior Publication Data

US 2002/0027283 A1 Mar. 7, 2002

Related U.S. Application Data

(62) Division of application No. 09/311,055, filed on May 14, 1999.

(30) Foreign Application Priority Data

May 15, 1998 (JP) .......................................... 10-133714

(51) Int. Cl.[7] .......................... H01L 23/15; H01L 23/12
(52) U.S. Cl. ...................... 257/703; 257/704; 257/732; 257/584
(58) Field of Search ......................... 257/584, 703–707, 257/723, 732, 731, 691, 729; 361/74, 100, 321, 386, 401, 717, 736

(56) References Cited

U.S. PATENT DOCUMENTS

| | | | |
|---|---|---|---|
| 3,303,265 A | * 2/1967 | Noren et al. ................ | 174/52.3 |
| 3,996,603 A | * 12/1976 | Smith .......................... | 257/668 |
| 4,788,626 A | 11/1988 | Neidig et al. | |
| 5,168,344 A | 12/1992 | Ehlert et al. | |
| 5,248,901 A | 9/1993 | Temple | |
| 5,297,001 A | * 3/1994 | Sterling ...................... | 361/717 |
| 5,446,314 A | 8/1995 | Melnick et al. | |
| 5,532,513 A | * 7/1996 | Smith et al. ................ | 257/703 |
| 5,689,089 A | * 11/1997 | Polak et al. ............... | 174/52.4 |
| 5,750,926 A | 5/1998 | Schulman et al. | |
| 5,942,796 A | 8/1999 | Mosser et al. | |
| 5,945,735 A | 8/1999 | Economikos et al. | |
| 6,078,501 A | 6/2000 | Catrambone et al. | |
| 6,297,549 B1 | * 10/2001 | Hiyoshi ...................... | 257/703 |
| 6,303,974 B1 | * 10/2001 | Irons et al. ................. | 257/584 |

FOREIGN PATENT DOCUMENTS

| | | |
|---|---|---|
| JP | 61-284943 | 11/1986 |
| JP | 3-76578 | 12/1991 |
| JP | 05-121577 | 5/1993 |

* cited by examiner

Primary Examiner—Eddie Lee
Assistant Examiner—Douglas W. Owens
(74) Attorney, Agent, or Firm—Oblon, Spivak, McClelland, Maier & Neustadt, P.C.

(57) ABSTRACT

This is a semiconductor power module provided with: a ceramic substrate; a metallic plate bonded to a surface of this substrate; a cylindrical metallic flange which is hermetically bonded to a surface of substrate or the metallic plate; a ceramic housing for hermetically sealing an opening of the metallic flange; and at least one or more semiconductor chips soldered to the metallic plate. The metallic flange is made of metal with a low thermal expansion coefficient. A hermetically sealed container is created by welding the metallic flange, the ceramic substrate and the housing with silver brazing. Moreover, external collector, emitter and gate electrodes are bonded on the housing by using the silver brazing. The collector, emitter and gate conductive pillars are respectively connected to the external collector, emitter and gate electrodes with calking. Thus, this hermetically sealed container is strong in mechanical strength and high in explosion-proof durability and excellent in moisture resistance. And this semiconductor power module has a high TFT reliability and a high TCT reliability. Moreover, a power cycle durability is larger since the emitter pedals are pressure-contacted to the emitter electrode pads disposed on the semiconductor chip via the metallic hemispheres so as to implement a large conductive capacity.

10 Claims, 14 Drawing Sheets

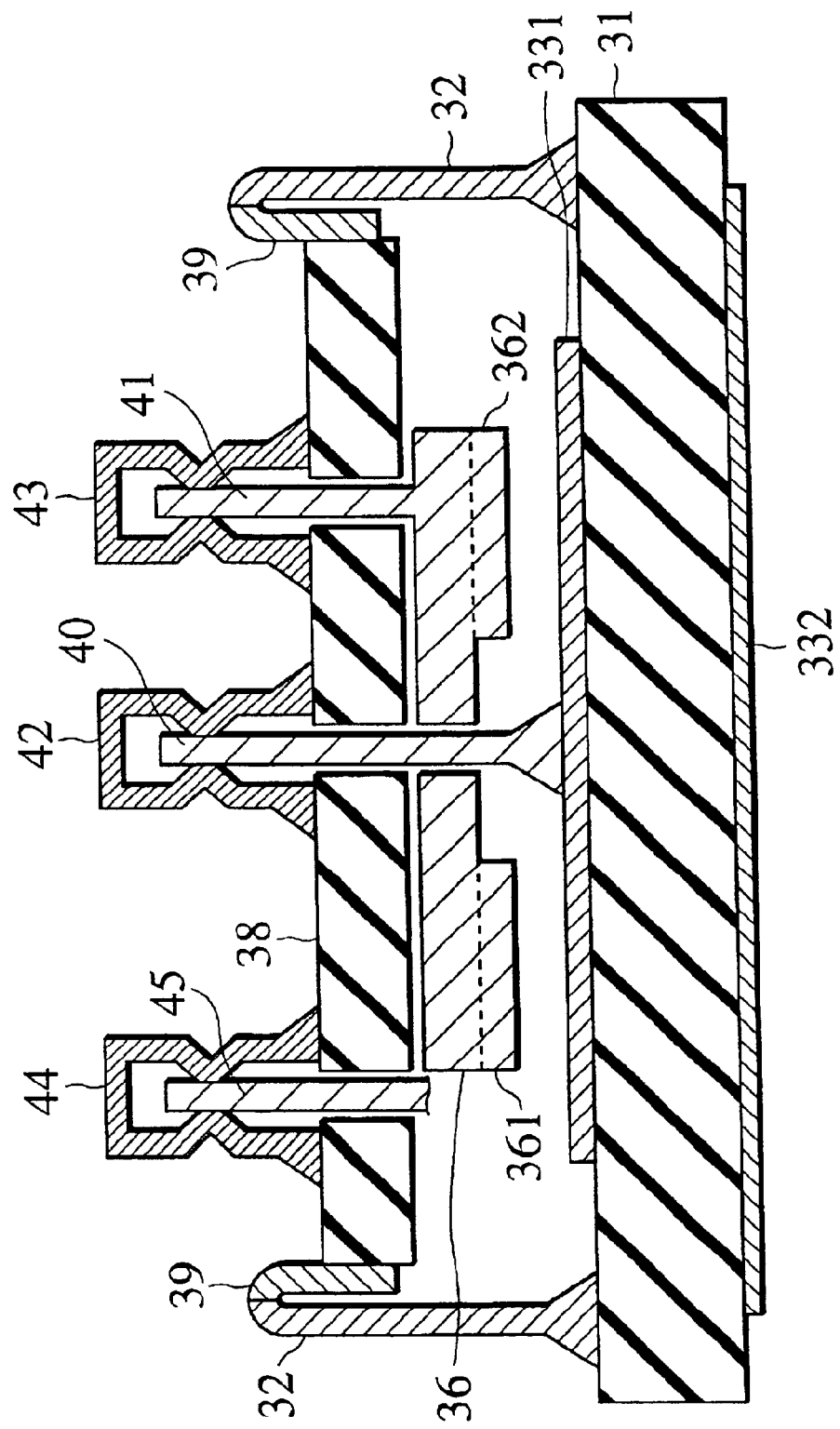

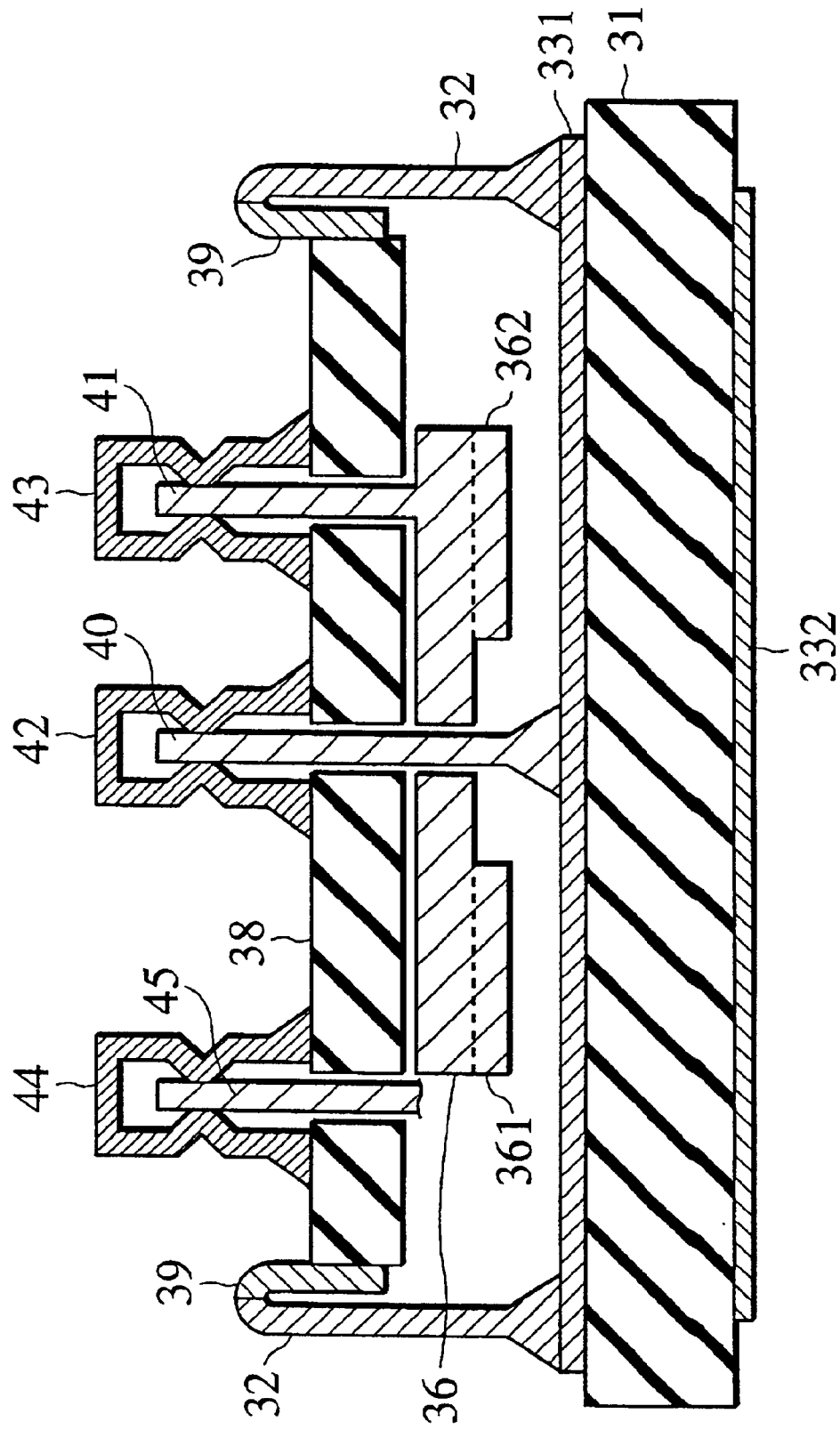

US 6,756,667 B2

HERMETICALLY SEALED SEMICONDUCTOR POWER MODULE AND LARGE SCALE MODULE COMPRISING THE SAME

BACKGROUND OF THE INVENTION

1. Field of the Invention

The present invention relates to a semiconductor power module which mounts a plurality of power semiconductor switches, such as insulated gate bipolar transistors (IGBTs), gate turn-off (GTO) thyristors and the like in a single package, and a large scale module comprising a plurality of the semiconductor power modules. More particularly, the present invention relates to the large scale module suitable for application fields in which various specifications are required as well as a high reliability for a long life. Especially, the present invention pertains to a power converter suitable for motion control of an electric locomotive, in which very severe reliability for a long life is substantially supposed in nature.

2. Description of the Related Art

As known in the art, the high frequency operation of the power converter can reduce the size and weight of the converter. And the power conversion at higher and higher frequencies is desired for power converters used in control systems for driving electric locomotives, since the compactness and the light weight of the converters suitable for installing in a railcar body are required to increase the transportation efficiency. And the high frequency power conversion of the power converters can simultaneously satisfy the comfortableness of passengers in trains. However, the higher reliability, which will guarantee a long life, is also required for the railcar power converters. For example, the reliability, which will guarantee the long life of more than about thirty years, is scheduled to be required for the next generation railcar power converters FIG. 1 is a broken sectional view showing an example of an inner structure of a conventional plastic IGBT module used in such a power converter. A plastic side wall 2 is bonded to an edge of a metallic cooling plate 1. A plastic terminal cap 3 covers a top surface of this plastic side wall 2. A copper plate 5, which is directly bonded or silver-brazed to a bottom surface of a ceramic substrate 4, is soldered onto the metallic cooling plate 1 through a solder 6. A copper plate constituting an emitter wiring pattern 71, a collector wiring pattern 72 and a gate wiring pattern 73 is bonded on a top surface of the ceramic substrate 4. A semiconductor chip 8, such as IGBT chip and the like, is soldered to this copper plate 72 through a solder 13.

An emitter electrode pad on the surface of the semiconductor chip 8 is electrically connected to the emitter wiring pattern 71 by aluminum bonding wires 91, and a gate electrode pad is electrically connected to the gate wiring pattern 73 by an aluminum bonding wire 92. In addition, an emitter terminal 10, a collector terminal 11 and a gate terminal 12 which are made of copper are respectively soldered through solders 13 to the emitter wiring pattern 71, the collector wiring pattern 72 and the gate wiring pattern 73 and are erected upwards. Heads of the emitter terminal 10, the collector terminal 11 and the gate terminal 12 are protruding from the outer surface of the terminal cap 3, which supports and fixes the emitter terminal 10, the collector terminal 11 and the gate terminal 12. Moreover, in order to shield the semiconductor chip 8 from outside air, it is filled with a silicon resin 14, and an epoxy resin 15 is filled onto this silicon resin 14.

The semiconductor power modules used to control the system of driving the electric locomotive are required for the high reliability under the severe conditions of higher temperatures and higher humidities. The above mentioned conventional plastic IGBT module has the structure sealed with the silicon resin 14 or the epoxy resin 15. However, since this resin seal is of semi-seal structure, the conventional plastic IGBT module is of an incomplete sealed structure. Thus, the conventional plastic IGBT module is weak in moisture resistance. So, under the environment of the high temperature and the high humidity, water permeates into the module to thereby cause the performance deterioration of the semiconductor chip 8. This is undesirable in view of the reliability of a long time as the semiconductor power module for the electric locomotive. In addition, there may be a possibility that impurities (sodium (Na), chromium (Cr) and the like) will gradually be doped in the silicon resin used for the resin sealing. This impurities will invade the semiconductor chip 8 during the long operation. This results in a problem that the reliability may drop.

Moreover, outer members 2, 3 constituting the semiconductor power module are made of plastic. Thus, they are also weak in mechanical strength. This results in a problem that the explosion-proof durability is substantially null when the semiconductor chip 8 is exploded by a short circuit accident and the like.

Especially, some kinds of the electric locomotives, such as a suburban train, a subway transit car, a streetcar or the like, frequently repeat starts and stops. Thus, the semiconductor power module used therein are expected to have a very high power cycle durability. For example, a semiconductor power module for an railcar in a next generation is planned to have a high power cycle durability of about ten million times, in a junction temperature variation $\Delta T_j = 40°$ C. and at a case temperature $T_c = 50°$ C. However, in the above mentioned conventional plastic IGBT module, the semiconductor chip 8 and the wiring patterns 71, 72 and 73 made of the copper plates are connected to each other through the aluminum bonding wires 91, 92. Hence, the power cycle durability of the conventional semiconductor power module is, for example, only about one hundred thousand times at present. Therefore, it is difficult to satisfy the required power cycle durability for the next generation railcar.

Moreover, the difference of the thermal expansion coefficients between the metallic cooling plate 1 and the ceramic 4 is large, and the railcar frequently repeats the starts and the stops so as to cause severe temperature fluctuations. Then, the crack caused by the thermal stress due to the severe temperature fluctuations is induced in the solder 6. This results in a problem that a Thermal Fatigue Test (TFT) reliability and a Thermal Cycling Test (TCT) reliability of the conventional semiconductor power module are both low and insufficient. On the contrary, the semiconductor power module for the electric railcar in the next generation is planed to have a TFT reliability of about 50 thousands cycles at $\Delta T_c = 70°$ C. ($T_c = 25°$ C. to 95° C.) and a TCT reliability of about 1000 cycles at $\Delta T_c = 165°$ C. ($T_c = -40°$ C. to 125° C.). However, a present semiconductor power module attains a low TFT reliability of about 5 thousands cycles and a low TCT reliability of about 100 to 300 cycles at the most, under the above mentioned conditions. This causes a problem that the planned specification will not be attained in the next generation.

On the other hand, various power converters, such as a DC—DC converter, a self-excitation inverter, a separate-excitation inverter and the like, are used in the respective control systems for driving the miscellaneous railcars. A rated specifications are variously changed depending on the type of railcar systems. For example, the suburban train requires a large scale module, which comprises a plurality of the semiconductor power modules, having a rated specification of a 800A, 3300 V class or a 1200A, 3300V class. The Japanese high speed train (referred as "the Shinkansen" train in Japanese) requires the large scale modules having a rated specification of a 1200A, 4500V class. "The InterCityExpress (ICE)", the high speed train in Germany and Switzerland or "the Train a Grande Vitesse (TGV)", the high speed train in France requires the large scale modules having rated specification of 1200A, 6500V classes. Then, various large scale modules having diversified rated specifications are required. Also, changes of the specification of the large scale modules often occur depending upon the changes of system designs. However, in the conventional large scale modules assembling plurality of semiconductor power modules, it is not easy to change the maximum current handling capability or the maximum operating voltage. This results in a problem that the rated specifications of the large scale modules can not be changed rapidly and simply.

Thus, a large scale module was desired and required which could easily change the rated specifications, having structure that could be changed rapidly corresponding to the various specifications requested by users with low cost.

SUMMARY OF THE INVENTION

The present invention is proposed to solve the above mentioned problems.

That is, it is therefore an object of the present invention to provide a semiconductor power module strong in moisture resistance and to provide a large scale module, or an assembly of the semiconductor power modules.

Another object of the present invention is to provide a semiconductor power module having a large explosion-proof durability and to provide a large scale module comprising the semiconductor power modules.

Still another object of the present invention is to provide a semiconductor power module having a high TFT reliability and a high TCT reliability, and to provide a large scale module comprising the semiconductor power modules.

Still another object of the present invention is to provide a semiconductor power module having an excellent power cycle durability and to provide a large scale module comprising the semiconductor power modules.

Still another object of the present invention is to provide a large scale module which can adjust the number of semiconductor chips mounted in a package, or in the large scale module so as to change the power handling capability and the maximum operating voltage of the large scale module rapidly and easily, and further to provide the large scale module having a flexibility of rated performances so that it can correspond quickly to various specifications requested by users without wasting cost.

In order to attain the above mentioned objects, the first feature of the present invention lies in a semiconductor power module provided with: a ceramic substrate; a metallic plate bonded to a surface of this substrate; a cylindrical metallic flange which is hermetically bonded to a surface of the substrate at an outer circumference of the substrate, separated from the metallic plate; a disk-shaped ceramic housing for hermetically sealing an opening of this metallic flange; and at least one or more semiconductor chips mounted on and soldered to the metallic plate on the surface of the ceramic substrate. Here, as the semiconductor chip, it is possible to use a semiconductor chip merging various semiconductor switching devices, such as an IGBT, a power MOSFET, a power bipolar transistor (power BJT), a GTO thyristor, a power static induction transistor (power SIT), a static induction thyristor (SI thyristor) and the like. In addition, as the ceramic substrate, it is possible to use various substrates, such as alumina ($Al_2O_3$), aluminum nitride (AlN), silicon nitride film ($Si_3N_4$), beryllia (BeO) and the like.

According to the first feature of the present invention, a hermetically sealed container is created by the ceramic substrate, the cylindrical metallic flange and the disk-shaped housing. For example, one or more semiconductor chips, such as IGBTs and the like, are accommodated in this hermetically sealed container. And this hermetically sealed container has a very high air-tightness. For example, the air leak rate of less than $10^{-4}$ Pa·m$^3$/sec ($10^{-5}$ atm·cm$^3$/sec) is easily obtained by this hermetically sealed container. Further, it is practically easy for this hermetically sealed container to have the higher air-tightness (the lower air leak rate) of, for example, about $10^{-8}$ Pa·m$^3$/sec ($10^{-9}$ atm·cm$^3$/sec) to $10^{-10}$ Pa·m$^3$/sec ($10^{-11}$ atm·cm$^3$/sec). In addition, the ceramic substrate, the metallic plate made of, for example, copper, bonded to the surface thereof and the metallic flange are brazed with silver brazing, aluminum brazing or the like. Moreover, the brazed portion can be sufficiently strong against the thermal stress resulting from the difference of the thermal expansion coefficient between the ceramic substrate and the metallic plate, or between the ceramic substrate and the metallic flange.

The second feature of the present invention lies in a semiconductor power module provided with: a ceramic substrate; a metallic plate bonded to a surface of the ceramic substrate; a metallic flange which is hermetically bonded to a surface of the metallic plate at boundary of, or at an outer circumference of the metallic plate; a disk-shaped ceramic housing for hermetically sealing an opening of this metallic flange; and at least one or more semiconductor chips soldered to the metallic plate on the surface of the ceramic substrate. Here, as the semiconductor chip, it is possible to use the semiconductor chip merging the various semiconductor switching devices, such the IGBT, the power MOSFET, the power BJT, the GTO thyristor, the power SIT, the SI thyristor and the like, similarly to the first feature. In addition, as the ceramic substrate, it is also possible to use the substrate, such as the $Al_2O_3$, the AlN, the $Si_3N_4$, the BeO or the like, similarly to the first feature.

According to the second feature of the present invention, the cylindrical metallic flange is bonded to the metallic plate made of, for example, copper or the like, where the metallic plate is bonded on a surface of the ceramic substrate. Thus, if the metallic flange is made of metal with a low thermal expansion coefficient, the three layered structure in which the high thermal expansion coefficient material (the metallic plate) is sandwiched by upper low thermal expansion coefficient material (the metallic flange) and lower low thermal expansion coefficient material (the ceramic substrate) is constructed. Then, in the three layered structure, the thermal stress ascribable to the difference of the thermal expansion coefficient between the ceramic substrate and the metallic plate is reduced by the compensating stress acting between the metallic plate and the cylindrical metallic flange. Hence, it is possible to further improve the TFT reliability and the TCT reliability.

The third feature of the present invention pertains to a large scale module comprising a plurality of semiconductor power modules. Here, as the semiconductor power module, it is possible to use the semiconductor power module described in the above mentioned first and second features of the present invention. Namely, the large scale module of the third feature comprises: a heat sink; a metallic frame having a plurality of openings disposed on the heat sink; a plurality of semiconductor power modules disposed on the heat sink so as to be mounted in the openings; a plurality of sealing members disposed between the respective semiconductor power modules and the metallic frame; a plastic cover for covering one surface of the metallic frame on which the semiconductor power module is mounted; and a resin filled into the cover.

According to the third feature of the present invention, if a desirable number of openings are formed on the metallic frame, it is possible to mount a desirable number of semiconductor power modules in the metallic frame. For example, the parallel connection of a desirable number of semiconductor power modules enables the formation of the large scale module having a desirable maximum current handling capability and power handling capability at the maximum operating voltage. In addition, if a desirable number of semiconductor power modules are mounted in the metallic frame and further they are connected in series, it is possible to assemble the large scale module having desirable operating voltages, desirable breakdown voltages, or desirable blocking voltages. Moreover, the selection and the combination of the parallel connection and the series connection enables the formation of a large scale module having any power handling capability and the maximum operating voltages. Therefore, by adjusting the number of semiconductor chips mounted in the metallic frame and selecting/combing the parallel/series connection, it is easy to response to the various specifications of users rapidly without costing extra money.

Further it is easy to construct various inverters or various converters having desirable maximum current handling capabilities, the desirable power handling capabilities, or the desirable maximum operating voltages, rapidly responding to various specifications imposed by miscellaneous users.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 2C is a cross sectional view taken on the direction II—II FIG. 2A;

FIG. 6B is a cross sectional view showing a structure of a semiconductor power module according to another embodiment of the present invention, in the plane corresponding to the plane along the direction II—II of FIG. 2A.

DETAILED DESCRIPTION OF THE PREFERRED EMBODIMENTS

Figure 1:
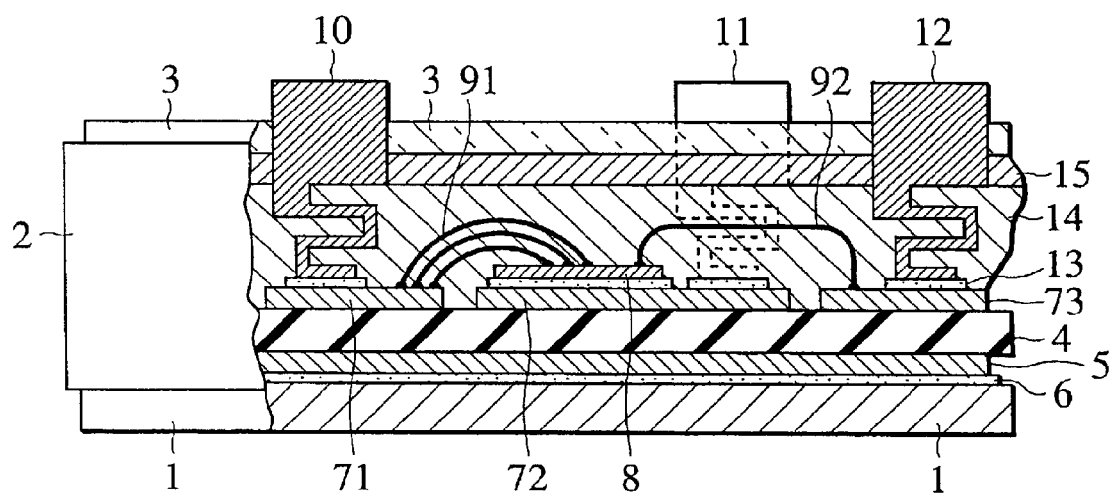
FIG. 1 is a cross sectional view showing a configuration of a conventional semiconductor power module.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thickness are arbitrarily drawn for facilitating the reading of the drawings.

First Embodiment

Figure 2A:
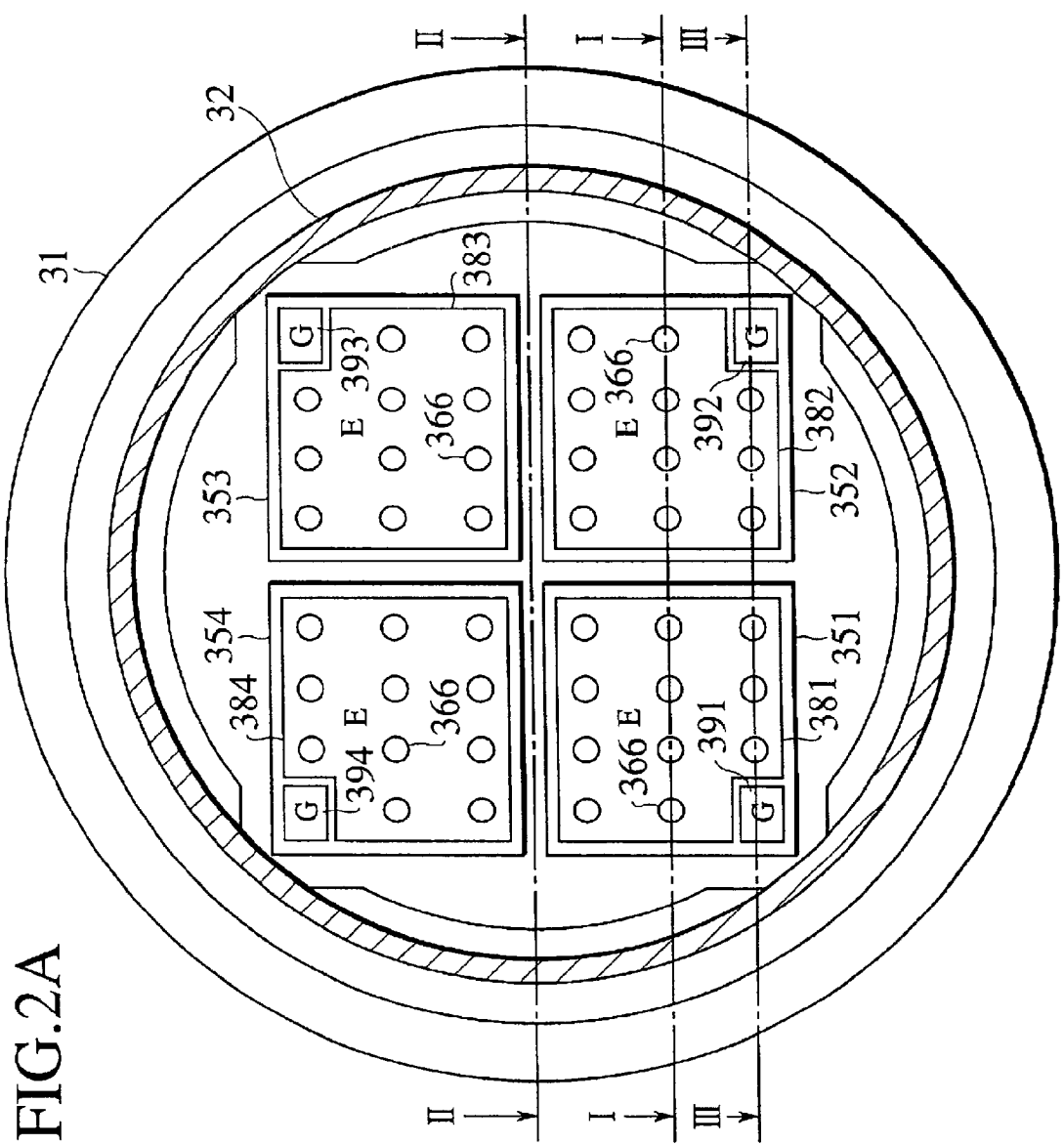
FIG. 2A is a plan view showing a structure of a semiconductor power module according to a first embodiment of the present invention.
Figure 2B:
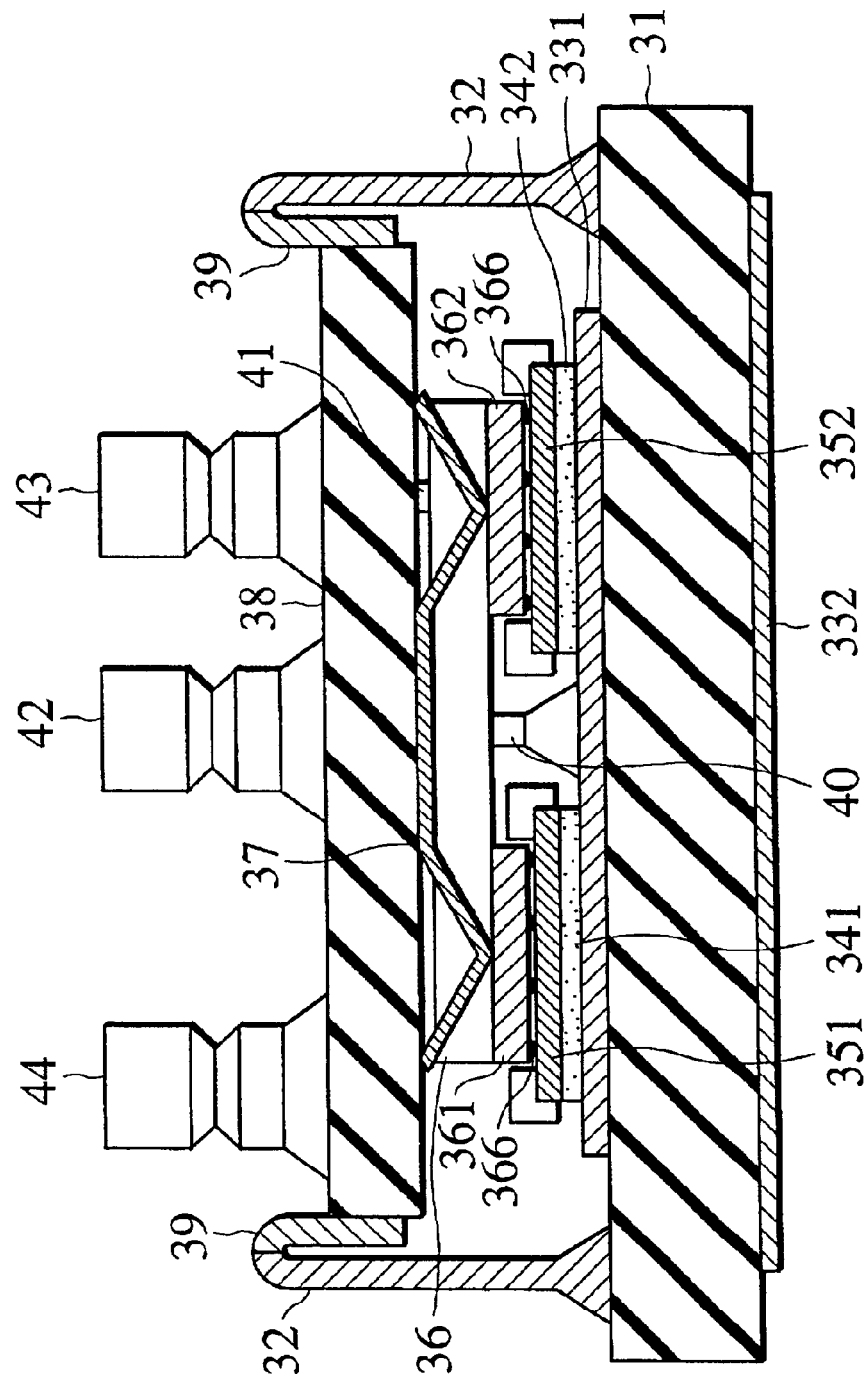
FIG. 2B is a cross sectional view taken on the direction I—I of FIG. 2A.
Figure 2D:
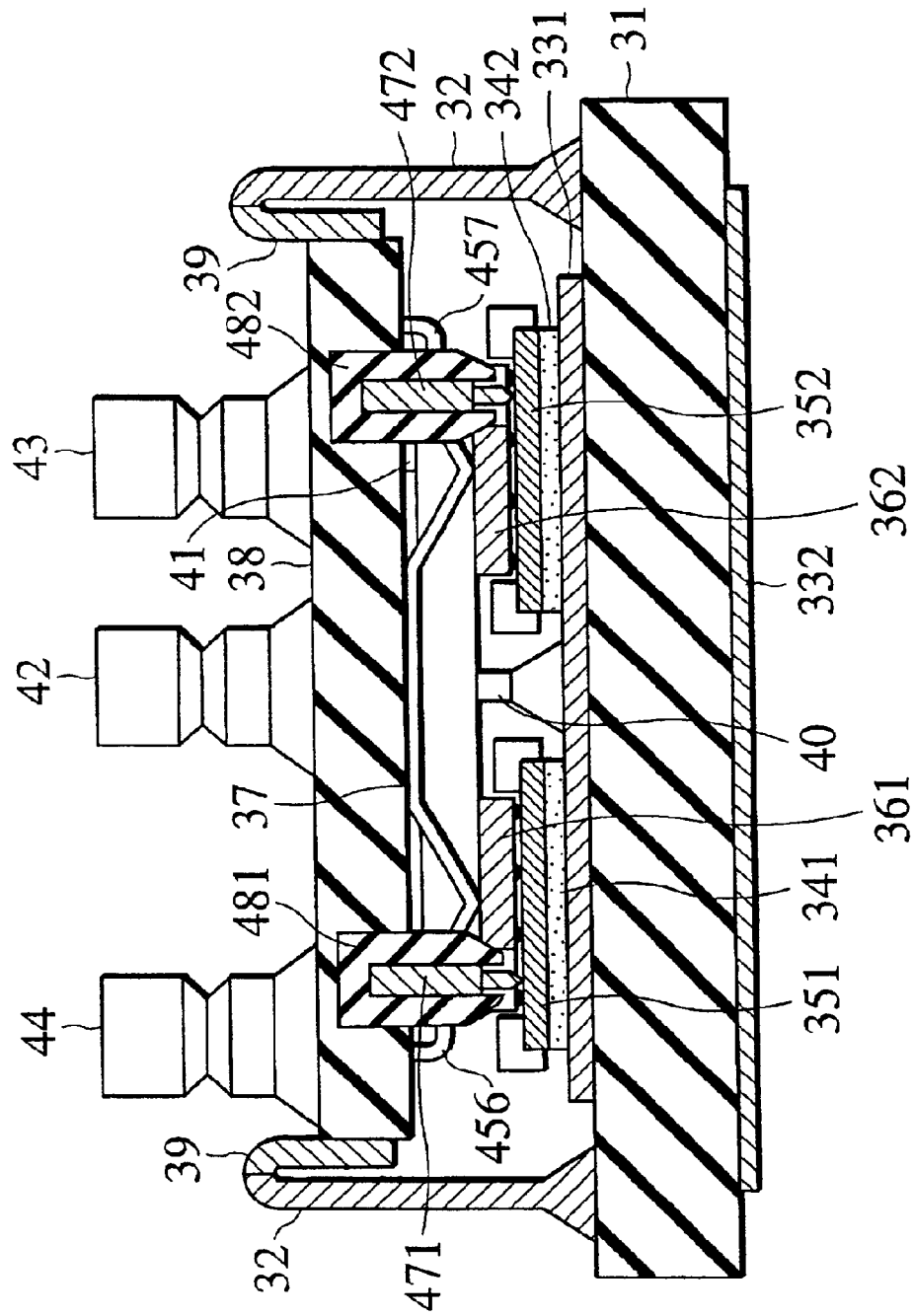
FIG. 2D is a cross sectional view taken on the direction III—III of FIG. 2A.

FIG. 2A is a cross sectional plan view showing the structure of a semiconductor power module according to a first embodiment of the present invention. FIGS. 2B, 2C and 2D are cross sectional views taken on the direction I—I, the direction II—II and the direction III—III of FIG. 2A, respectively. As shown in FIG. 2A, the semiconductor power module according to the first embodiment of the present invention comprises four semiconductor chips 351, 352, 353 and 354 merging IGBTs respectively on their chips, the four semiconductor chips 351, 352, 353 and 354 are mounted on a ceramic substrate 31, and the periphery thereof is surrounded with a circular flange 32 made of metal with low thermal expansion coefficient. On the semiconductor chips 351, 352, 353 and 354, emitter electrode pads 381, 382, 383 and 384 and gate electrode pad 391, 392, 393 and 394, each made of metallic thin film such as aluminum thin film or aluminum alloy (Al—Si, Al—Cu—Si) thin film, are disposed respectively.

As shown in FIGS. 2B, 2C and 2D, a copper plate 331 is bonded to the top surface of the ceramic substrate 31, and a copper plate 332 is bonded to the bottom surface thereof by the brazing, such as the silver brazing, the aluminum brazing or the like, respectively. The flange 32 is bonded to the outer side of the copper plate 331 at the boundary of and on the top surface of the ceramic substrate 31, similarly by the brazing, such as the silver brazing, the aluminum brazing or the like. Such brazing is conducted based on "an activated metallizing method" using surface catalyst, such as titanium (Ti) and the like. Such brazing enables the bonding interfaces between the ceramic substrate 31 and the copper plate 331, 332 and between the ceramic substrate 31 and the flange 32 to be bonded under excellent mechanical strength. As a matter of fact, brazing layers each having a thickness of 2 to several microns are present on the respective bonding interfaces between the ceramic substrate 31 and the copper plates 331, 332 and between the ceramic substrate 31 and the flange 32. However, the explanations thereof on FIGS. 2B, 2C and 2D are omitted to avoid cluttering up the drawing.

Figure 2E:
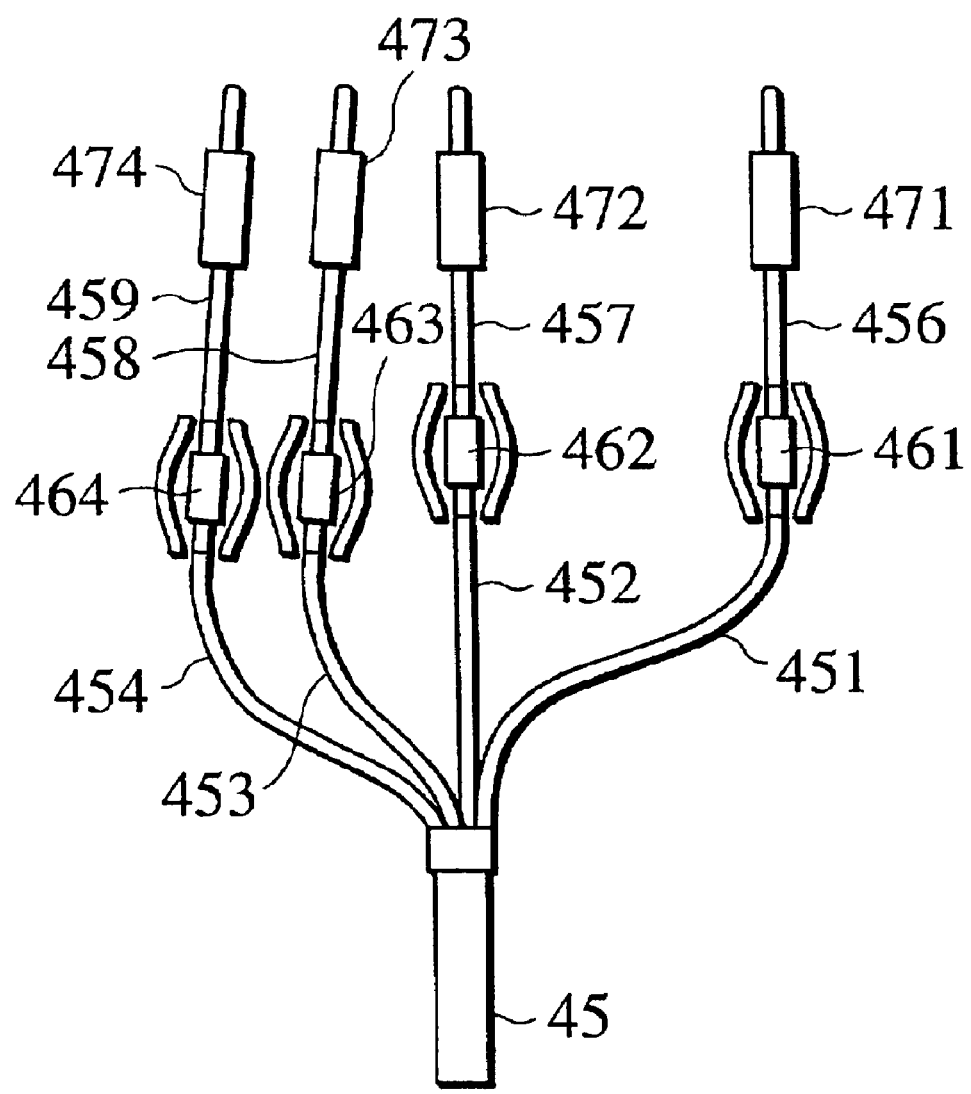
FIG. 2E is a schematic view showing the gate wirings of the semiconductor power module according to the first embodiment of the present invention.
Figure 2F:
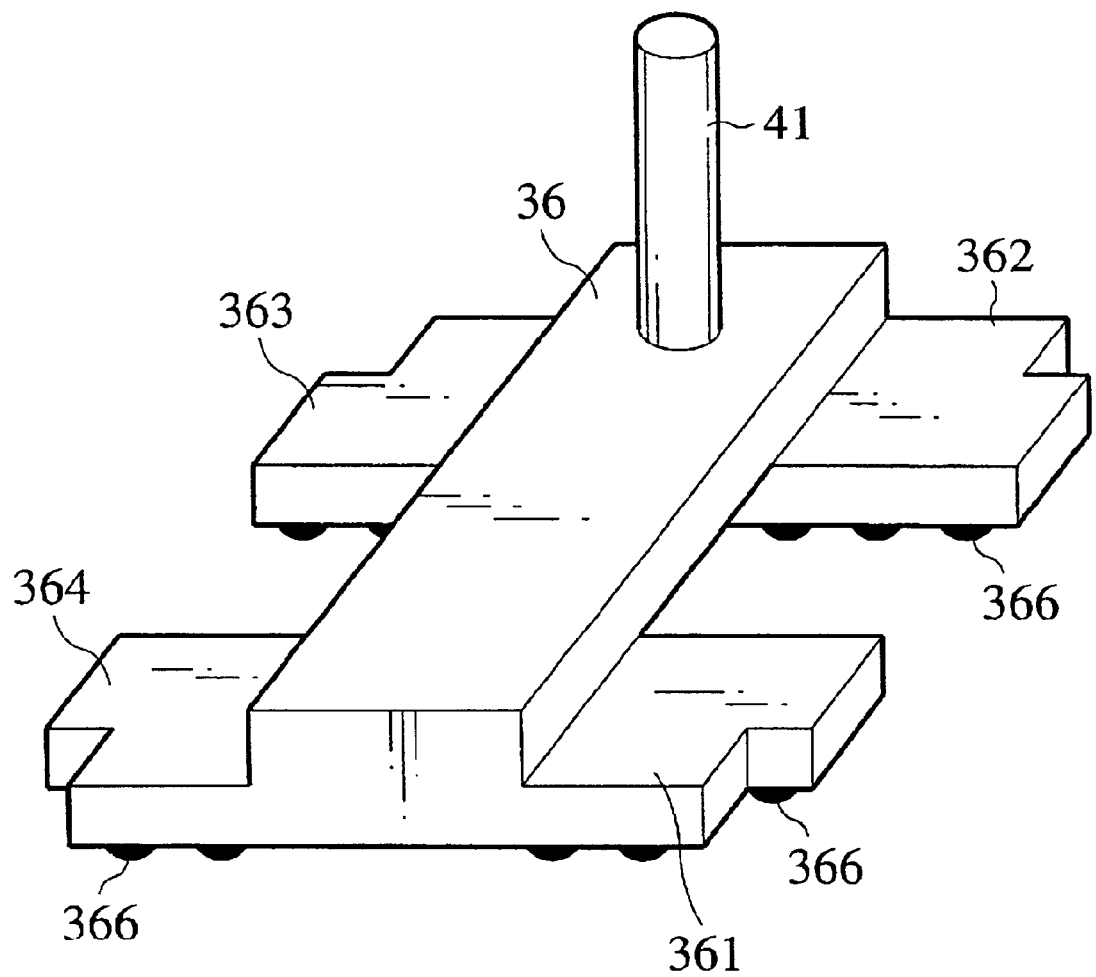
FIG. 2F is a bird's eye view showing an example of the emitter electrode member of the semiconductor power module according to the first embodiment of the present invention.

A semiconductor chip 351 is soldered onto the copper plate 331 through a solder 341 having a thickness of about 100 μm, and a semiconductor chip 352 is also soldered onto the copper plate 331 through a solder 342. An emitter pedal (conductive electrode pedal) 361 of emitter electrode member made of molybdenum (Mo) is pushed against an IGBT emitter electrode pad disposed on a main surface of the semiconductor chip 351 by a spring 37 through a plurality of metallic hemispheres or bumps 366, such as solder balls, silver bumps and the like. Similarly, an emitter pedal (conductive electrode pedal) 362 of emitter electrode member is pushed against an emitter electrode pad disposed on a main surface of the semiconductor chip 352 by the spring 37 through a plurality of metallic hemispheres 366. The other semiconductor chips 353, 354, although they are arranged at the back of the page and are not shown, have the structures similar to those of the semiconductor chips 351, 352. The emitter pedals (conductive electrode pedals) 361, 362 for contacting with the respective emitter electrodes via the metallic hemispheres 366 are connected to backbone 36 of the emitter electrode members, as shown in FIG. 2F. On the bottom surface of each emitter pedals (conductive electrode pedals) 361 to 364, the plurality of metallic hemispheres 366 are attached. In this way, the four emitter pedals (conductive electrode pedals) 361 to 364 of the emitter electrode members are pressure-contacted to the respective emitter electrode pads with low Ohmic contact resistance to accordingly form emitter electrode paths. As shown in FIG. 2B, the spring 37 generates the pushing force against the four emitter pedals 361 to 364 since it is pushed from above by a ceramic housing 38.

Although, on every bottom surface of emitter pedals (conductive electrode pedals) 361 to 364, the plurality of metallic hemispheres 366 are attached to be pressure-contacted with the emitter electrode pads in FIG. 2F, it is possible to employ the emitter pedals having flat bottom surfaces. In this case, we should prepare copper (Cu) foils, each having the plurality of metallic hemispheres. Then the copper foils are respectively sandwiched between the emitter pedals having the flat bottom surfaces and emitter electrode pads, and the copper foils are pressure-contacted to the respective emitter electrode pads by employing the similar spring force applied on the top surface of the emitter pedals.

An annular member 39 made of metal with low thermal expansion coefficient is connected to a boundary end of the ceramic housing 38 with the brazing, such as the silver brazing and the like. Then, the upper portion of this annular member 39 is welded to the top end of the flange 32.

In addition, as shown in FIG. 2D, gate probe pins 471 and 472 are pushed against the IGBT gate electrode pads 391 and 392 (see FIG. 2A) disposed on the respective main surfaces of the four semiconductor chips 351 to 354 via insulators 481 and 482 through springs not shown in the figure. Similarly, at the back of the FIG. 2D, gate probe pins 473 and 474 (not shown) are pushed against the IGBT gate electrode pads 393 and 394 (see FIG. 2A). As shown in FIG. 2E, four gate probe pins 471 to 474 converge on a single gate conductive pillar 45 made of copper through sheathed cables (or coaxial cables) 451–454 and 456–459. At the mid points of respective sheathed cables, four gate resisters 461–464 having the required resistance are intervened.

Bottom surfaces serving as collectors of the four semiconductor chips 351 to 354 are soldered to the copper plate 331, respectively. Thus, the copper plate 331 serves as an IGBT collector electrode wiring portion. A collector conductive pillar 40 made of copper is vertically erected near the center of this copper plate 331 by the soldering. Then, as shown in FIG. 2C, it penetrates the backbone 36 of the emitter electrode member, and further penetrates the ceramic housing 38, and projects towards external portion.

In addition, an emitter conductive pillar 41 made of copper is uprightly erected on the backbone 36 of the emitter electrode member, and it penetrates the ceramic housing 38 and then projects towards the external portion. The collector conductive pillar 40 is tightly connected to a cap-shaped external collector electrode 42 made of copper that is uprightly bonded on the ceramic housing 38 by the brazing, such as the silver brazing, the aluminum brazing or the like, with calking. Similarly, the emitter conductive pillar 41 is tightly connected to a cap-shaped external emitter electrode 43 made of copper uprightly bonded on the ceramic housing 38 by the brazing, with the calking. Further, the gate conductive pillar 45 is tightly connected to a cap-shaped external gate electrode 44 made of copper uprightly bonded on the ceramic housing 38 by the brazing, with the calking.

According to the first embodiment of the present invention, the lower end of the flange 32 is brazed to the ceramic substrate 31, and the upper end thereof is brazed to the ceramic housing 38 through the member 39 made of the metal with the low thermal expansion coefficient that is welded and connected to the flange 32, and thereby the hermetically sealed space is created. Moreover, the penetration holes of the collector conductive pillar 40, the emitter conductive pillar 41 and gate conductive pillar 45 which project above the ceramic housing 38 are air-tightly blocked with the cap-shaped external collector electrode 42, the cap-shaped external emitter electrode 43 and the cap-shaped external gate electrode 44 by the brazing. Thus, a container has an extremely high air-tightness of about $10^{-8}$ Pa·m$^3$/sec ($10^{-9}$ atm·cm$^3$/sec) to $10^{-10}$ Pa·m$^3$/sec ($10^{-11}$ atm·cm$^3$/sec). Accordingly, this can make the moisture resistance very high, and perfectly prevent humidity, corrosive gas and the like from invading the container and also prevent the trouble of the four semiconductor chips 351 to 354. Hence, this can extremely improve the reliability.

A metallic material whose thermal expansion coefficient is close to that of the ceramic, such as 42 Alloy, 36 Alloy or the like, is desirable for the material of the flange 32. In addition, these metals are strong in mechanical strength and also strong in brazing stress. Thus, an annealed material is desirable in order to drop the mechanical strength. It is possible to select such a material to largely reduce the thermal stress resulting from the difference of the thermal expansion coefficient between the respective members to further improve the TFT reliability and the TCT reliability.

In addition, the metal and the ceramic are bonded to each other by the welding and the brazing to accordingly form the hermetically sealed container. Thus, the mechanical strength thereof is extremely larger than that of the plastic or the like. Hence, even if the semiconductor chips 351, 352, . . . are exploded by the short circuit failure and the like, the hermetically sealed container is never broken due to the sufficient explosion-proof durability, which improves the safety.

Moreover, each emitter electrode pad of the semiconductor chips 351, 352, . . . is connected to the external emitter electrode 43 projecting above the ceramic housing 38 by pressure-contacting the emitter electrode member 36 through the metallic hemispheres 366 without using a bonding wire such as an aluminum wire and the like. Further, each collector electrode layer on the bottom surfaces of the semiconductor chips 351, 352, . . . is bonded to the external collector electrode 42 on the ceramic housing 38 by the soldering to the copper plate 331. Thus, the conductive capacity on each electrode path can manifest an extremely large value. The electrode paths constituting the semiconductor power module are created by such conductive members having the large conductive capacity, which can extremely improve the power cycle durability of the semiconductor power module. For example, it is possible to easily achieve the power cycle durability of about ten million times or more at the junction temperature variation $\Delta T_j=40°$ C. and the case temperature of $T_c=50°$ C., and also possible to achieve the power cycle durability of about one hundred thousand times or more at the junction temperature variation $\Delta T_j=100°$ C. and the case temperature of $T_c=50°$ C.

In addition, since the semiconductor power module according to a first embodiment of the present invention does not require the metallic cooling plate 1, which has been inevitable to the conventional semiconductor power module, even if the thermal expansion coefficients of the ceramic substrate 31 and the copper plate 331 are different from each other, the crack is not induced. Hence, it is possible to improve the TCT durability. For example, it is possible to easily achieve the TCT reliability of about 1000 cycles or more at $T_c=165°$ C.

In addition, since the dimension of the semiconductor power module according to the first embodiment can be made substantially identical to those of the conventional modules, the similar dimension specification can be used.

As detailed above, in the semiconductor power module according to the first embodiment of the present invention, the plurality of semiconductor chips are accommodated in the container that is hermetically sealed by the metal and the ceramic to have the high air-tightness. Then, the emitter electrode pads disposed on the top surface of the semiconductor chips are respectively connected to the conductive member having the large conductive capacity by the pressure-contacting. Moreover, the brazing, such as the silver brazing, the aluminum brazing or the like is performed on the portion receiving the thermal stress. Then, the metallic cooling plate is removed. Thus, this can improve the moisture resistance, the explosion-proof durability, the TFT reliability and the TCT reliability and the power cycle durability to thereby make the property of the semiconductor power module extremely higher.

Second Embodiment

Figure 3A:
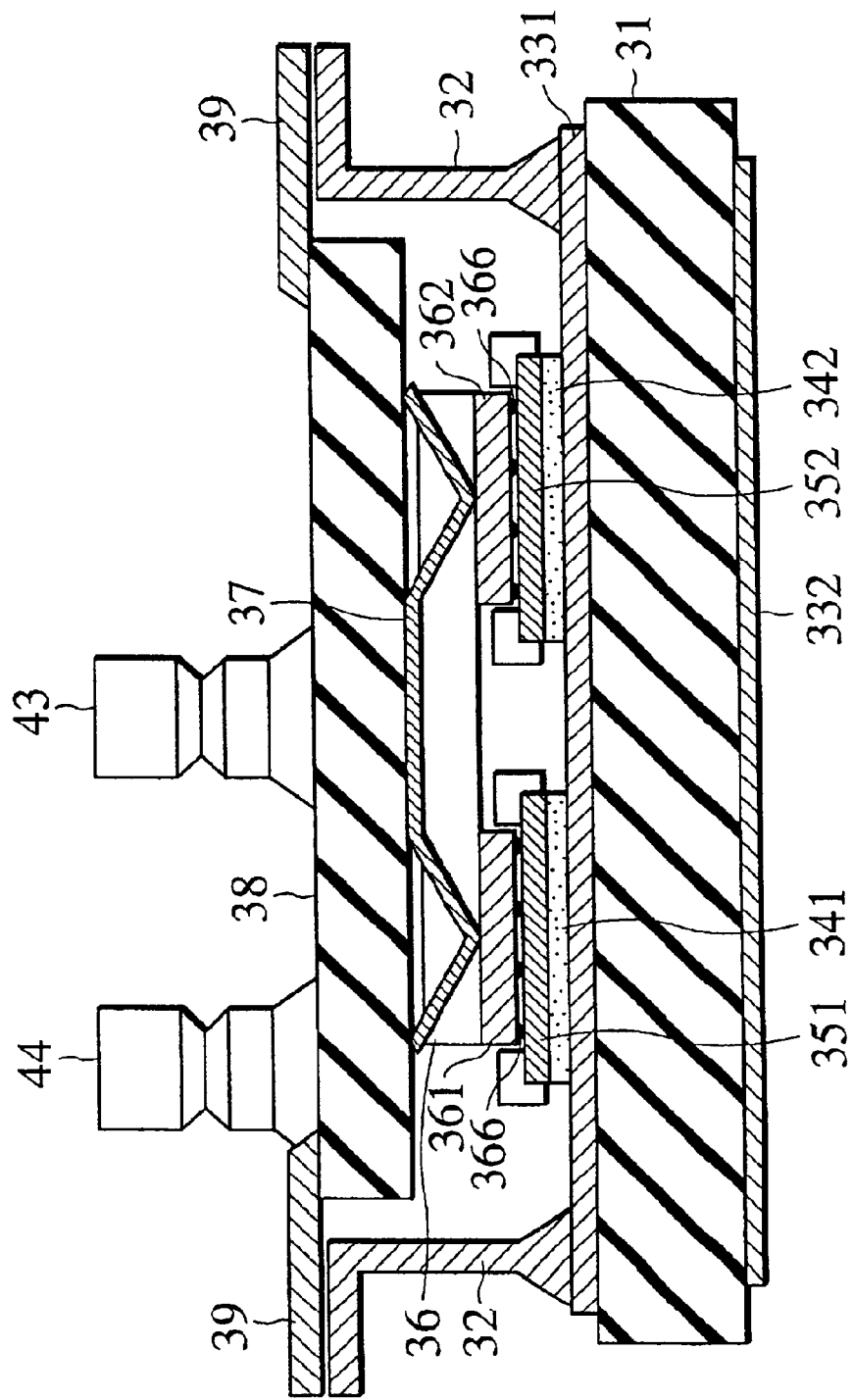
FIG. 3A is a cross sectional view showing a structure of a semiconductor power module according to a second embodiment of the present invention, in a plane corresponding to the plane along the direction I—I of FIG. 2A.
Figure 3B:
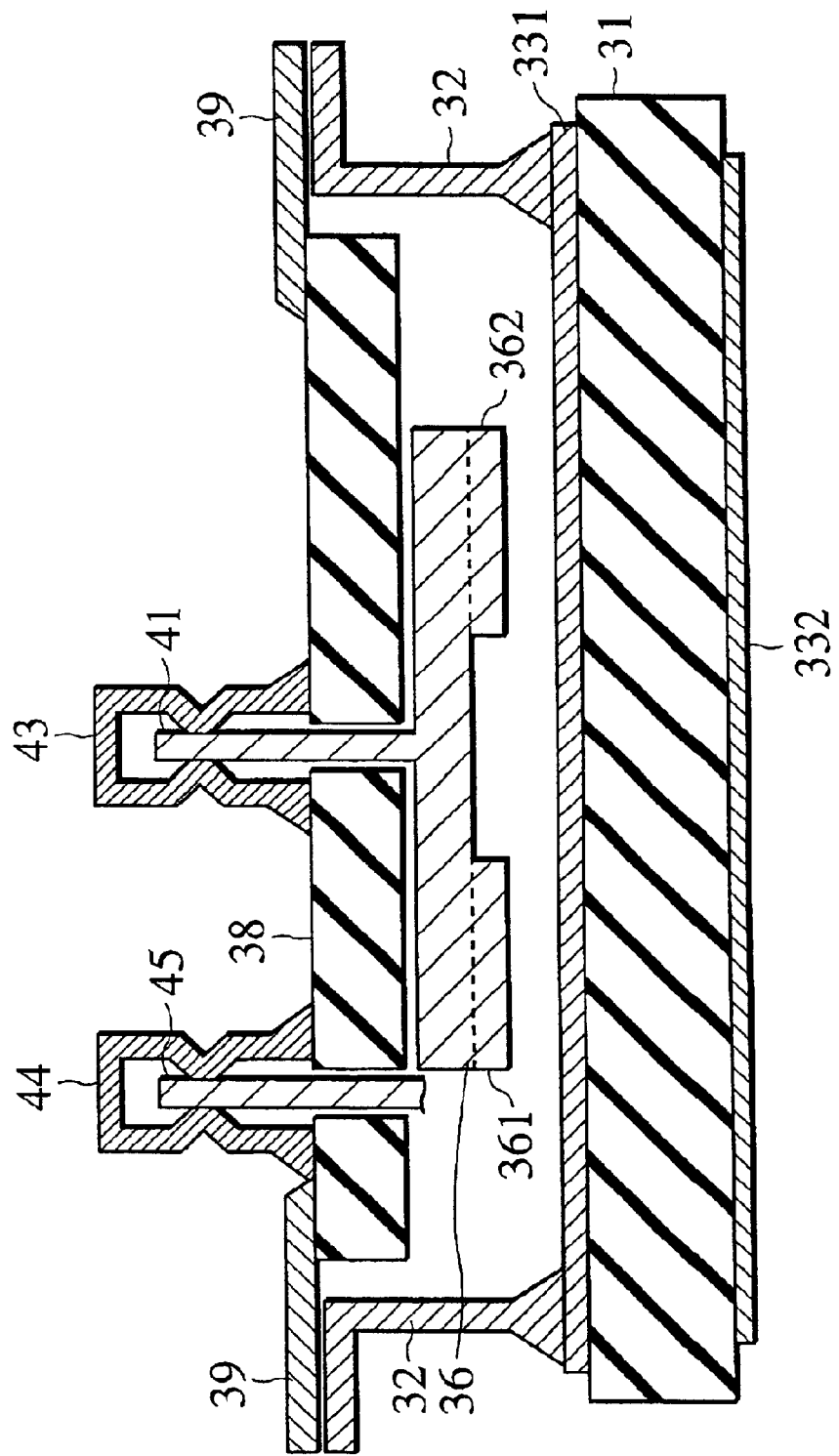
FIG. 3B is a cross sectional view showing a structure of the semiconductor power module according to the second embodiment of the present invention, in a plane corresponding to the plane along the direction II—II FIG. 2A.

FIGS. 3A and 3B are cross sectional views showing a structure of a semiconductor power module according to a second embodiment of the present invention. Also, four semiconductor chips are mounted on the ceramic substrate 31, in the semiconductor power module according to the second embodiment of the present invention. A plan view thereof is omitted since it is identical to that of the first embodiment of the present invention. That is, FIG. 3A is a cross sectional view in a plane corresponding to a plane along the direction I—I of FIG. 2A, shown as the plan view of the first embodiment of the present invention, and FIG. 3B is a cross sectional view in a plane corresponding to a plane along the direction II—II FIG. 2A. Respective IGBTs are merged on the four semiconductor chips.

As shown in FIGS. 3A and 3B, in the semiconductor power module according to the second embodiment of the present invention, a copper plate 331 is bonded to a top surface of a ceramic substrate 31 with the brazing, such as the silver brazing, the aluminum brazing or the like. This copper plate 331 is a circular plate having a larger diameter than that of the copper plate of the first embodiment of the present invention. Moreover, a cylindrical flange 32 made of metal with low thermal expansion coefficient is bonded onto this copper plate 331 with the brazing, such as the silver brazing, the aluminum brazing or the like. The bottom surface of a semiconductor chip 351 is soldered to this copper plate 331 through a solder 341, and the bottom surface of a semiconductor chip 352 is soldered thereto through a solder 342. Since the bottom surfaces of the semiconductor chips 351, 352 are IGBT collector electrode layers, the copper plate 331 serves as an IGBT collector electrode wiring portion. In addition, the flange 32 made of the metal with the low thermal expansion coefficient is electrically bonded to the copper plate 331. Thus, the flange 32 also doubles as the collector electrode of the semiconductor power module.

As shown in FIG. 3B, a cap-shaped external emitter electrode 43 and a cap-shaped external gate electrode 44 are uprightly bonded on a ceramic housing 38 with the brazing in the semiconductor power module according to the second embodiment of the present invention. Then, this cap-shaped external emitter electrode 43 is tightly connected an emitter electrode pillar 41 uprightly erected on a backbone 36 of emitter electrode member with the calking. The cap-shaped external gate electrode 44 is tightly connected an gate electrode pillar 45 to which four gate probe pins converge. The other structure is similar to that of the first embodiment shown in FIGS. 2A, 2B and 2C.

In the semiconductor power module according to the second embodiment of the present invention, the flange 32 made of the metal with the low thermal expansion coefficient is bonded onto the copper plate 331 with the brazing. That is, the ceramic substrate 31 having a small thermal expansion coefficient is fixed on the bottom surface of the copper plate 331 having a large thermal expansion coefficient, and the flange 32 having a small thermal expansion coefficient is fixed on the top surface of the copper plate 331. Thus, the thermal expansion of the copper plate 331 is suppressed from both the sides. In this way, the suppression of the thermal expansion of the copper plate 331 enables the TCT durability of the second embodiment to be improved over that of the first embodiment.

In addition, it is not necessary to provide a dedicated external collector electrode on the ceramic housing 38 since the flange 32 doubles as the external collector electrode without reducing the power cycle durability. Correspondingly, this can make the apparatus smaller to simultaneously simplify a process of assembling the semiconductor power module to thereby improve the productivity. The other structure is similar to that of the first embodiment shown in FIGS. 2A and 2B. Moreover this structure provides the similar effectiveness and advantages as those of the first embodiment.

As detailed above, in the semiconductor power module according to the second embodiment of the present invention, the semiconductor chips are accommodated in the container that is created by the metal and the ceramic and has the high air-tightness. Then, the emitter pedals 361, 362, . . . are contacted to emitter electrode pads of the semiconductor chips 351, 352, . . . through the metallic hemispheres 366 without using a bonding wire such as an aluminum wire and the like so that the conductive capacity on the electrode path to the external emitter electrode 43 can manifest an extremely large value. Moreover, the brazing is performed on the portion receiving the thermal stress. Furthermore, the metallic cooling plate can be removed. Thus, this can improve the moisture resistance, the explosion-proof durability, the TFT reliability and the TCT reliability and the power cycle durability to thereby make the performance of the semiconductor power module extremely higher.

Third Embodiment

Figure 4:
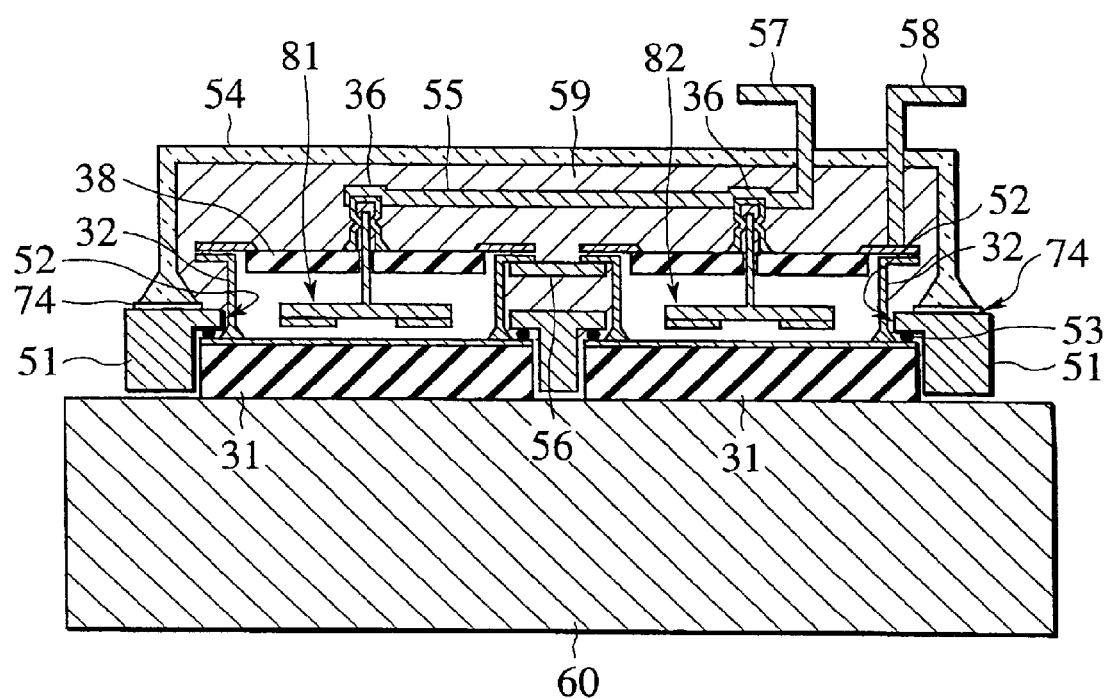
FIG. 4 is a cross sectional view showing a structure of a large scale module according to a third embodiment of the present invention.
Figure 5:
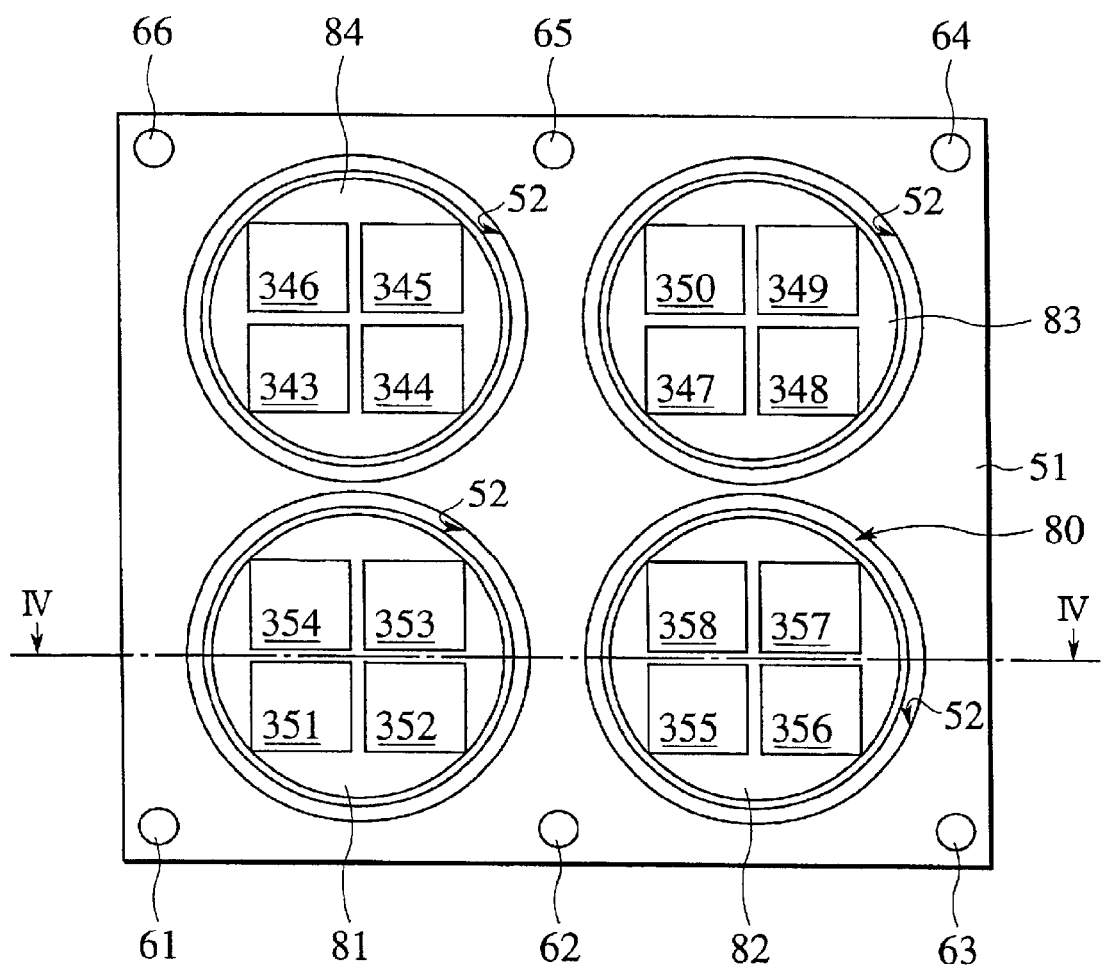
FIG. 5 is a cross sectional plan view of the large scale module shown in FIG. 4.

FIG. 4 is a vertical cross sectional view taken on the direction III—III of FIG. 5, which is a cross sectional plan view of the large scale module according to the third embodiment of the present invention.

As shown in FIG. 5, a flange (metallic frame) 51 constituting the outer contour of the large scale module according to the third embodiment of the present invention has a rectangular plane and has a plurality of (six) screw stop holes 61 to 66 in the periphery thereof. Then, this flange (metallic frame) 51 has a plurality of (four) circular openings 52 for accommodating a plurality of (four) semiconductor power modules 81 to 84. Although the opening 52 is circular in FIG. 5, it is naturally allowable that the opening 52 is rectangular, hexagonal or other shapes.

As shown in FIG. 4, a plastic cover 54 is adhered and bonded to the upper portion of the screw stop flange 51 through a resin based adhesive 74 and the like. This plastic cover 54 covers semiconductor power modules 81 to 84. That is, six screws (not shown) penetrate the six screw stop holes 61 to 66 shown in FIG. 5, respectively. Then, the flange (metallic frame) 51 is fixed on a large heat sink 60 with the screws. Accordingly, the plastic cover 54 pushes down the semiconductor power modules 81 to 84 at a constant pressure. As a result, the semiconductor power modules 81 to 84 are pushed against the heat sink 60 and fixed therein. For example, as these four small semiconductor power modules 81 to 84, the semiconductor power module shown in FIGS. 3A and 3B in accordance with the second embodiment of the present invention can be employable. As shown in FIG. 4, sealing members or sealing rubbers (sealing rings) 53 are mounted in and under the protruding tongues of the openings 52, the sealing members (the sealing rubbers) 53 are positioned between the outer edges of the semiconductor power modules 81 to 84 and the protruding tongues of the flange 51, respectively. Thus, the inside of the plastic cover 54 is hermetically sealed by the fact that the protruding tongues of the flange 51 pushes down the outer edges of the semiconductor power modules 81 to 84 through the sealing members (the sealing rubbers) 53.

An outer emitter electrode 57, an outer collector electrode 58 and an outer gate electrode (not shown in FIG. 4) are positioned over the plastic cover 54 as electrodes of the large scale module according to the third embodiment of the present invention. The semiconductor power modules 81, 82, . . . may comprise the ceramic substrate 31, a plurality of semiconductor chips having the IGBTs mounted on the ceramic substrate 31 and the flange 32 surrounding the periphery of the semiconductor chips, similarly to the first or second embodiments. The IGBT emitter electrodes 36 disposed on the ceramic housings 38 over the semiconductor power modules 81, 82, . . . are connected in parallel to each other through conductive materials 55. And the IGBT collector electrodes 32 doubling as the flange 32 are connected in parallel to each other through another conductive materials 56. Although not shown in the figure, the IGBT gate electrodes disposed on the ceramic housing over the semiconductor power modules 81, 82, . . . are connected in parallel to each other through another conductive materials. These conductive materials 55, 56 are bonded to the upper portion of the plastic cover 54 and connected to the outer emitter electrode 57 and the outer collector electrode 58. Moreover, the inside of the plastic cover 54 is filled with a gelled silicon resin 59, epoxy resin or the like, in order to make the mechanical strength and the insulation strength higher.

According to the third embodiment of the present invention, the large scale module is assembled by mounting the plurality of semiconductor power modules 81 to 84 (four, in the third embodiment of the present invention) into the screw stop flanges 51 and then connecting them parallel to each other. Thus, it is possible to easily achieve a desirable maximum current handling capability by freely selecting the number of semiconductor power modules 81, 82, . . . to be used. Hence, the large scale module according to the third embodiment of the present invention can response to various power and voltage specifications requested by users and design changes thereof rapidly and easily.

In addition, the third embodiment of the present invention shows the example in which the semiconductor power modules 81, 82, . . . are electrically connected parallel to each other. However, they may be connected in series. It is possible to connect the predetermined number of semiconductor power modules 81, 82, . . . in series to easily achieve a predetermined breakdown voltage and a blocking voltage requested by the users and also response to various circuit specifications requested by the users and miscellaneous design changes thereof rapidly and easily.

For example, the suburban train requires the large scale module having the rated specification of the 800A, 3300 V class or the 1200A, 3300V class. The long-distance high speed trains require the larger operating voltages, namely "the Shinkansen" super express train in Japan demands the large scale module having the rate specification of the 1200A, 4500V class. On the other hand, "the ICE" train in Germany/Switzerland and "the TGV" train in France require higher voltage type large scale module having the rated specification of the 1200A, 6500V class. In the large scale module according to the third embodiment of the present invention, it is possible to adjust the number of semiconductor power modules to be mounted in the metallic frame and to select the best combination of the series connection and the parallel connection to thereby change the maximum power handling capability and the maximum operating voltage of the large scale module, without wasting further time and efforts. And further, it is easy to respond rapidly to the various specifications requested by different users and the design changes, without requiring further increase of manufacturing cost.

Other Embodiments

Various modifications will become possible for those skilled in the art after receiving the teachings of the present disclosure without departing from scope thereof.

Figure 6A:
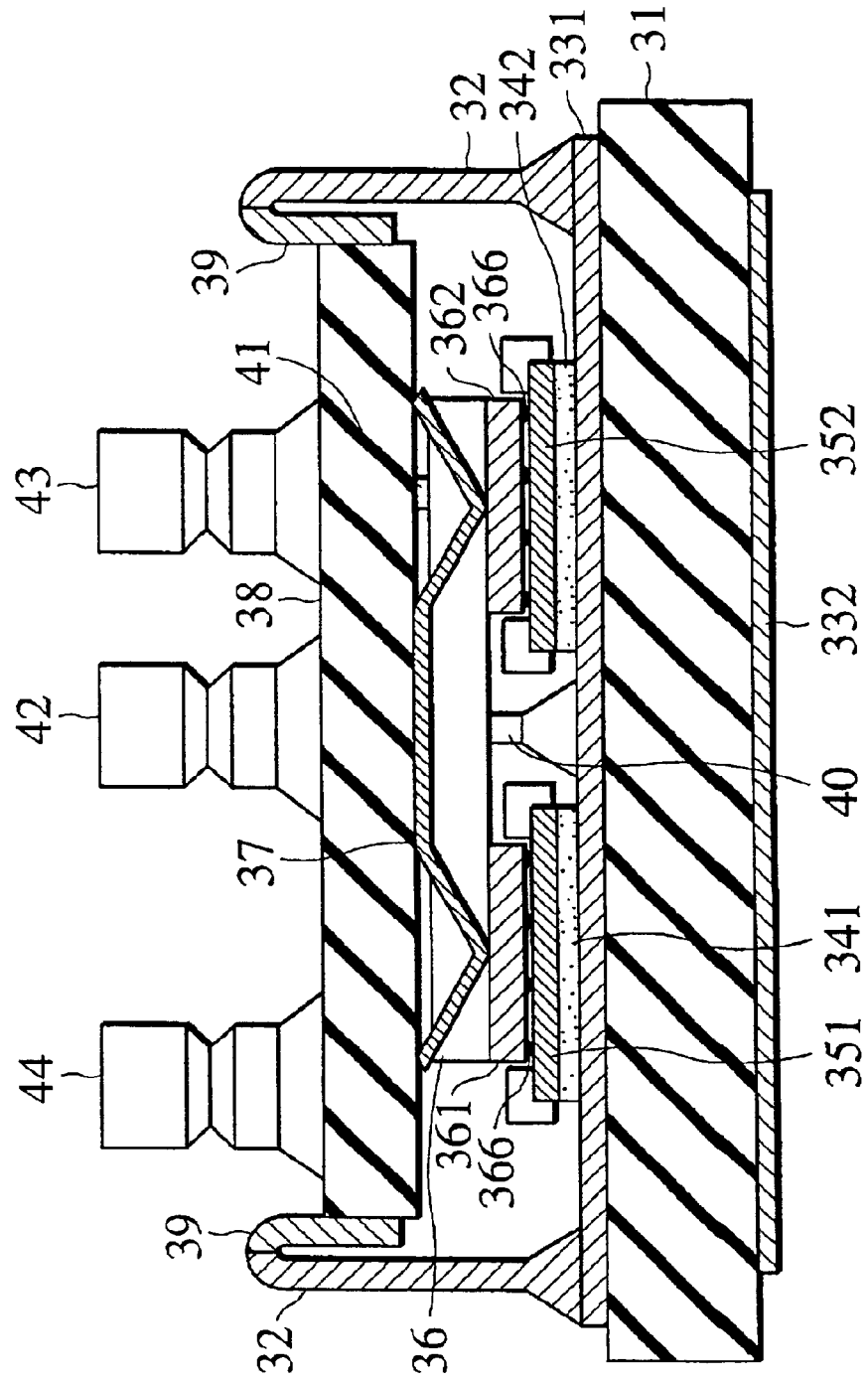
FIG. 6A is a cross sectional view showing a structure of a semiconductor power module according to another embodiment of the present invention, in the plane corresponding to the plane along the direction I—I of FIG. 2A.

For example, it is also possible to combine the structure of the semiconductor power module according to the first and the second embodiments of the present invention to thereby put both the merits to the practical use. FIGS. 6A and 6B are cross sectional views showing a structure of a semiconductor power module in which the first and the second embodiments of the present invention are combined. FIG. 6A is a cross sectional view in the plane corresponding to the plane along the direction I—I of FIG. 2A, shown as the plan view of the first embodiment of the present invention. FIG. 6B is a cross sectional view in the plane corresponding to the plane along the direction II—II of FIG. 2A. Four IGBTs are merged in respective four semiconductor chips.

As shown in FIGS. 6A and 6B, a copper plate 331 having a large diameter similar to that of the second embodiment is bonded to the semiconductor power module according to another embodiment of the present invention. Moreover, a flange 32 is bonded onto this copper plate 331 with the brazing. Bottom surfaces of semiconductor chips 351, 352 are soldered to this copper plate 331 through solders 341, 342, respectively. The copper plate 331 serves as a collector electrode wiring portion of IGBT. In addition, the flange 32 made of metal with low thermal expansion coefficient is electrically bonded to the copper plate 331. However, differently from the second embodiment, the flange 32 does not function as the collector electrode of the semiconductor power module. Separately, a dedicated cap-shaped external collector electrode 42 made of copper is prepared and uprightly bonded on a ceramic housing 38 with the brazing, as shown in FIGS. 6A and 6B. This structure of the external collector electrode 42 is similar to that of the first embodiment of the present invention. That is, a collector conductive pillar 40 made of copper is uprightly erected near the center of the copper plate 331. Then, this collector conductive pillar 40 penetrates a backbone 36 of an emitter electrode member, and further penetrates the ceramic housing 38 and projects towards external portion. This collector conductive pillar 40 is connected to the external collector electrode 42 with the calking. The structure of an external emitter electrode 43 and an external gate electrode 44 are similar to those of the first and second embodiments. Thus, the explanation thereof is omitted.

According to the semiconductor power module shown in FIGS. 6A and 6B, the thermal expansion of the copper plate 331 is suppressed by the members which are bonded on both the surfaces and have small thermal expansion coefficients. In this way, the suppression of the thermal expansion of the copper plate 331 can improve the TCT durability. In review, the flange 32 has served as the collector electrode in the second embodiment of the present invention. However, in a case of the flange 32 made of the metal with the low thermal expansion coefficient, it is difficult to make an electric resistance thereof smaller. So, this involves the increase of the forward voltage drop and the heat dissipation in the flange 32, and also makes the electromagnetic shield insufficient. On the contrary, the dedicated collector conductive pillar 40 and cap-shaped external collector electrode 42 made of the material with the small electric resistance are provided in the semiconductor power module as shown in FIGS. 6A and 6B so as to improves the disadvantages in the second embodiment. Thus, it is possible to improve the TCT durability while ensuring the small resistances of the external collector electrode and the collector electrode fetching portion connected to this external collector electrode. Moreover, the moisture resistance, the explosion-proof durability and the power cycle durability can be improved similarly to the first and second embodiments.

Figure 7:
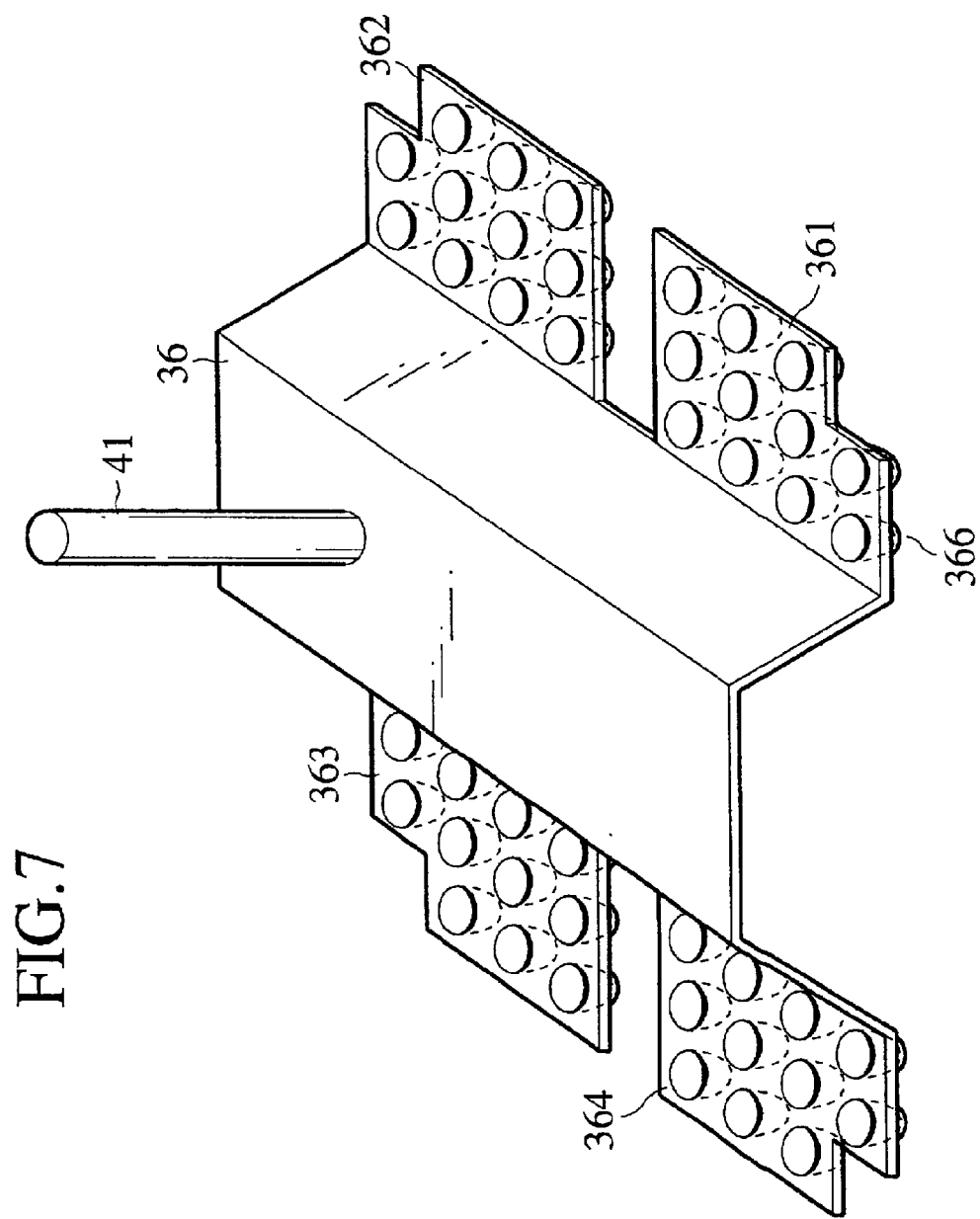
FIG. 7 is a bird's eye view showing another example of the emitter electrode member of the semiconductor power module of the present invention.

The structure of the emitter electrode members is not limited as shown in FIG. 2F. FIG. 7 is a bird's eye view showing another example of the emitter electrode member of the semiconductor power module of the present invention. In FIG. 7, four emitter pedals (conductive electrode pedals) 361 to 364 and backbone 36 of emitter electrode member are made of relatively thin plate of metal—such as molybdenum (Mo)—as a single body by punching and mechanical press. Further, each emitter pedals (conductive electrode pedals) 361 to 364 is pressed to form a plurality of metallic hemispheres 366 protruding downward from the bottom surface of each emitter pedals 361 to 364. Then the emitter pedals 361 to 364 can contact with the emitter electrode pads disposed on the semiconductor chip via the metallic hemispheres 366 with the aid of the spring, pushing force against the top surface of emitter pedals 361 to 364. And an emitter conductive pillar 41 is brazed on top surface of backbone 36 to erect upwards.

Of course, the semiconductor power module and the large scale module in the present invention are not limited to the semiconductor power module or the large scale module used in the power converter for the system of driving the railcar. They can be applied to a ground facility for supplying electric power to the electric railcars or a system of driving linear motor cars, and can be also applied to a case of rotating a screw by using an electric motor with a power generated by an internal combustion engine installed in a ship. Moreover, the semiconductor power module and the large scale module in the present invention can be applied to various motor drive applications such as in an electric vehicle, an elevator, an escalator or the like. In addition, they can be applied to various inverters/converters in miscellaneous fields, such as an electric power field, an energy field, a communication field and the like.

As mentioned above, the present invention naturally includes various embodiments which are not described here. Therefore, the technical range of the present invention is defined only by the following claims.

What is claimed is:

1. A semiconductor power module eliminating use of bonding wires, comprising:

(a) a uniform and circular ceramic substrate;
   (b) a circular metallic plate bonded to a surface of said substrate;
   (c) a cylindrical metallic flange serving as an electrode, a lower end of the metallic flange is hermetically bonded to a surface of said metallic plate at a boundary of said metallic plate;
   (d) a disk-shaped ceramic housing for disposing a second electrode and for hermetically sealing an opening of said metallic flange; and
   (e) at least one or more semiconductor chips mounted on and soldered to said metallic plate.

2. The semiconductor power module of claim 1, further comprising an annular metallic member disposed above the semiconductor chip, and bonded to an outer circumference of said ceramic housing, wherein an end of said metallic member is bonded to an upper end of said metallic flange with a welding.

3. The semiconductor power module of claim 1, wherein a bottom surface of said semiconductor chip and said metallic flange are electrically connected to each other through said metallic plate.

4. The semiconductor power module of claim 1, wherein an electrode path associated with said second electrode is formed by pressure-contacting a conductive electrode pedal to an electrode pad disposed on said semiconductor chip.

5. The semiconductor power module of claim 4, wherein in said ceramic housing, said conductive electrode pedal is pressure-contacted to said semiconductor chip through a pressure applied to a spring.

6. The semiconductor power module of claim 1, wherein said metallic flange is a metal having a small thermal expansion coefficient.

7. The semiconductor power module of claim 1, wherein said semiconductor chip is an IGBT.

8. The semiconductor power module of claim 4, further comprising:
- a conductive pillar electrically connected to said conductive electrode pedal; and
- a cap-shaped external electrode aligned to a through hole penetrating said ceramic housing, uprightly bonded on said ceramic housing configured such that said conductive pillar is tightly connected to said cap-shaped external electrode with calking.

9. The semiconductor power module of claim 8, wherein said conductive electrode pedal is attached to a backbone having said conductive pillar.

10. The semiconductor power module of claim 4, further comprising a plurality of metallic hemispheres sandwiched between said conductive electrode pedal and said semiconductor chip.

* * * * *